United States Patent
Ou et al.

(10) Patent No.: US 9,735,283 B2
(45) Date of Patent: Aug. 15, 2017

(54) FABRICATION OF IGZO OXIDE TFT ON HIGH CTE, LOW RETARDATION POLYMER FILMS FOR LDC-TFT APPLICATIONS

(71) Applicant: Covestro Deutschland AG, Leverkusen (DE)

(72) Inventors: Eric Chuan Whatt Ou, Singapore (SG); Sivaramakrishan Sankaran, Singapore (SG); Khine Myat Sint Ma, Singapore (SG); Christian Häβler, Wendelstein (DE); Axel Schmidt, Köln (DE)

(73) Assignee: Covestro Deutschland AG, Leverkusen (DE)

( * ) Notice: Subject to any disclaimer, the term of this patent is extended or adjusted under 35 U.S.C. 154(b) by 0 days.

(21) Appl. No.: 15/023,770

(22) PCT Filed: Sep. 25, 2014

(86) PCT No.: PCT/EP2014/070502
§ 371 (c)(1),
(2) Date: Mar. 22, 2016

(87) PCT Pub. No.: WO2015/044275
PCT Pub. Date: Apr. 2, 2015

(65) Prior Publication Data
US 2016/0218220 A1    Jul. 28, 2016

(30) Foreign Application Priority Data

Sep. 27, 2013  (EP) .................................... 13186279

(51) Int. Cl.
*H01L 29/786* (2006.01)
*H01L 29/49* (2006.01)
(Continued)

(52) U.S. Cl.
CPC ........ *H01L 29/7869* (2013.01); *H01L 21/022* (2013.01); *H01L 21/0274* (2013.01);
(Continued)

(58) Field of Classification Search
CPC ........... H01L 21/02118; H01L 21/0274; H01L 21/022; H01L 21/02178; H01L 27/1225;
(Continued)

(56) References Cited

U.S. PATENT DOCUMENTS 2,970,131 A    1/1961  Moyer, Jr.
2,991,273 A    7/1961  Hechelhammer et al.
(Continued)

FOREIGN PATENT DOCUMENTS

| DE | 1570703 A1 | 2/1970 |
|----|------------|--------|
| DE | 2 063 050 A1 | 7/1972 |
| DE | 2 063 052 A1 | 7/1972 |
| DE | 2211956 A1 | 10/1973 |
| FR | 1561518 A | 3/1969 |
| GB | 1122003 A | 7/1968 |
| GB | 1229482 A | 4/1971 |
| GB | 1367790 A | 9/1974 |

OTHER PUBLICATIONS

International Search Report for PCT/EP2014/070502 mailed Nov. 19, 2014.

*Primary Examiner* — Allan R Wilson
(74) *Attorney, Agent, or Firm* — Drinker BIddle & Reath LLP

(57) ABSTRACT

The present invention provides a TFT on a polymer substrate and a method for producing the TFT. The TFT is, due to its characteristics, particularly suited for applications as backplane in LCD displays and solar cell devices.

14 Claims, 10 Drawing Sheets

(51) Int. Cl.
  *H01L 21/02* (2006.01)
  *H01L 21/027* (2006.01)
  *H01L 27/12* (2006.01)
  *H01L 29/24* (2006.01)
  *H01L 29/423* (2006.01)
  *H01L 29/45* (2006.01)
  *H01L 29/51* (2006.01)
  *H01L 29/66* (2006.01)

(52) U.S. Cl.
  CPC .. *H01L 21/02118* (2013.01); *H01L 21/02178* (2013.01); *H01L 27/1225* (2013.01); *H01L 27/1259* (2013.01); *H01L 29/24* (2013.01); *H01L 29/42356* (2013.01); *H01L 29/45* (2013.01); *H01L 29/495* (2013.01); *H01L 29/4908* (2013.01); *H01L 29/4958* (2013.01); *H01L 29/4966* (2013.01); *H01L 29/51* (2013.01); *H01L 29/66969* (2013.01); *H01L 29/78603* (2013.01)

(58) Field of Classification Search
  CPC ............ H01L 27/1259; H01L 29/7869; H01L 29/42356; H01L 29/495; H01L 29/24; H01L 29/51; H01L 29/4958; H01L 29/66969; H01L 29/4966; H01L 29/45; H01L 29/78603; H01L 29/4908
  See application file for complete search history.

(56) References Cited

U.S. PATENT DOCUMENTS

| | | |
|---|---|---|
| 2,999,835 A | 9/1961 | Goldberg |
| 2,999,846 A | 9/1961 | Schnell et al. |
| 3,028,365 A | 4/1962 | Schnell et al. |
| 3,062,781 A | 11/1962 | Bottenbruch et al. |
| 3,148,172 A | 9/1964 | Fox |
| 3,271,367 A | 9/1966 | Schnell et al. |
| 3,275,601 A | 9/1966 | Schnell et al. |
| 3,879,348 A | 4/1975 | Serini et al. |
| 5,595,789 A * | 1/1997 | Bier .................. C08J 7/047 427/386 |
| 2006/0099526 A1* | 5/2006 | Yang ................ H01L 27/283 430/58.5 |
| 2009/0200605 A1* | 8/2009 | Bjoerk ............... B82Y 10/00 257/330 |
| 2010/0224878 A1 | 9/2010 | Kimura |
| 2010/0258794 A1* | 10/2010 | Iwasaki ............ H01L 29/7869 257/43 |
| 2012/0064708 A1 | 3/2012 | Miyoshi et al. |
| 2015/0364720 A1* | 12/2015 | Itoh .................. B32B 27/06 428/446 |

* cited by examiner

FABRICATION OF IGZO OXIDE TFT ON HIGH CTE, LOW RETARDATION POLYMER FILMS FOR LDC-TFT APPLICATIONS

CROSS-REFERENCE TO RELATED APPLICATIONS

This application is a national stage application (under 35 U.S.C. §371) of PCT/EP2014/070502, filed Sep. 25, 2014, which claims benefit of European Application No. 13186279.9, filed Sep. 27, 2013, both of which are incorporated herein by reference in their entirety.

The present invention relates to a thin film transistor array on a high CTE, low retardation polymer substrate and a method to produce the same. These thin film transistors can be used as TFT backplanes for LCD applications.

BACKGROUND OF THE INVENTION

During the past years, the need for organic or thin film transistors (TFT) in industry for use in manufacturing screens of mobile phones, computer and television has increased. Moreover, there is a request for providing TFT on flexible substrates, hence, the replacement of glass by more flexible compounds as substrates. Thus, flexible electronics is a rapidly emerging area with possible applications in displays, sensors, medical electronics, identification tags, etc. Organic TFTs, etc. A variety of flexible substrates including metal foil, thin glass, polyimide (PE) and polyethylene naphthalate (PEN) have been utilized to realize flexible electronics. Even though organic TFTs are one of the best candidates due to their flexibility, there is still a need for promising material of high yield, reasonable mobility, and reliability. Furthermore, process temperature issues need to be overcome, since most flexible material substrates require low temperature processes, while the transistor materials require processes at higher temperatures.

Today, several examples for TFT on flexible materials exist. The gate insulator on an oxide TFT on glass is a plasma-enhanced chemical vapour deposition (PECVD) silicon nitride or silicon oxide thin film. For IGZO oxide TFT on flexible substrate, methyl siloxane as a gate dielectric has been used to fabricate an IGZO oxide TFT on paper (Nackbong Choi, Sharhukh A. Khan, Xiaoxiao Ma, Miltiadis Hatalis, 2011). Methyl siloxane has the advantage over strictly PECVD silicon nitride or silicon oxide as they have high resistance to breakage. A P-type ZnO may be obtained by a donor-acceptor co-doping method (T. Yamamoto and H. Katayama-Yoshida, 1999) (Yamamoto, 2002), by increasing the N concentration with group-III elements. A P-type IGZO was obtained by co-sputtering IGZO with 7% AlN target with an RF power of 60 W, sputtering pressure of $2 \times 10^{-2}$ Toff and 0.6% 02 atmosphere. A rectifying diode device was realized by combining a n-type IGZO and p-type IGZO. (Kenkochiro Kobayashi, Yoshiumi Kohno, Yasumasa Tomita, Yasuhisa Maeda and Shigenori Matsushima, 2011) Printed and spin coated P3HT based TFT have been fabricated on polycarbonate film (Sung Kyu Park, Yong Hoon Kim, Jeong In Han, Dae Gyu Moon, Won Keun Kim, Min Gi Kwak, 2003). However, the mobilities of these devices are very low and the fabrication methods are not very practical and extensible to industry setup.

BRIEF SUMMARY OF THE INVENTION

Accordingly, there exists a need for a high quality TFT on a flexible material which can be produced by an efficient method acceptable for industry applications.

Hence, the present invention provides
a thin film transistor on a polymer substrate, comprising
a gate electrode (200);
a gate insulating film (300) covered by the gate electrode (200), the gate insulating film (300) comprising methylsiloxane;
a semiconductor channel layer (500) placed to face the gate electrode (200) with the gate insulating film (300) interposed therebetween, the semiconductor channel layer (500) comprising a metal oxide composition comprising an oxide of at least one of Hf, In, Ga, and Zn and mixtures thereof;
a source drain pattern (450) comprising a source electrode connected to the semiconductor layer (500) and a drain electrode separated from the source electrode and connected to the semiconductor layer (500),
wherein the semiconductor layer (500) has a source portion that contacts the source electrode, a drain portion that contacts the drain electrode, and a channel portion that is located between the source and drain portions;
wherein the gate electrode (200) and the source and gate electrodes (450) comprise at least one of Al, Ti, Mo, AlNd, a stack metal electrode Ti/Al/Ti, or a transparent conducting oxide selected from the group consisting of indium tin oxide, indium doped zinc oxide, aluminum doped zinc oxide, fluorine tin oxide, antimony tin oxide, and mixtures thereof;
a polymer substrate (100 comprising a thermoplastic polymer.

DETAILED DESCRIPTION OF THE INVENTION

The TFT according to the present invention exhibits a certain flexibility and a good field effect mobility. A particular problem associated with the use of inorganic thin film with low coefficients of thermal expansion (CTE) such as $SiO_2$ gate insulators used in IGZO TFT is that they tend to crack when the temperature is changed during fabrication processes. This is thought to be related to a CTE mismatch between the substrate, the thin film gate insulators and the other TFT components. In the present invention, a methylsiloxane film is used as a gate dielectric (gate insulating film (300)). This has the effect that the TFT according to the present invention, in particular the gate dielectric, exhibits better stability on thermal changes during fabrication processes, i.e., a reduced tendency to crack upon heating.

In a preferred embodiment of the present invention, the methylsiloxane in the gate insulating film (300) has a methyl content in the range of from $\geq 1$ wt.-% to $\leq 13$ wt.-%, preferably in the range of from $\geq 6$ wt.-% to $\leq 11.5$ wt.-%. This relatively low methyl content in the methylsiloxane further enhances the thermal stability during the production processes and reduces the tendency to crack. Furthermore, the use of methylsiloxane having a methyl content in the above ranges makes it easier to etch the gate dielectric using reactive ion etching. It further increases the etch selectivity of the gate dielectric and the photoresist. Moreover, the resulting film has a higher refractive index compared to films obtained by using a methylsiloxane having a methyl content of, e.g., 15 wt.-%. Methylsiloxane preparations which may be used in the TFT and the method for its production according to the present invention are, for example, available under the name Accuglass® from Honeywell such as Accuglas® T-14, in particular Accuglas® T-214 and T-314.

The semiconductor channel layer (500) comprises a metal oxide composition comprising an oxide of at least one of Hf, In, Ga, or Zn and mixtures thereof. In a preferred embodiment, the semiconductor channel (500) comprises an indium gallium zinc oxide (IGZO) layer. An indium gallium zinc oxide (IGZO) layer is well known in the art. In an embodiment of the present invention, the IGZO layer is an n-channel IGZO layer. In a further preferred embodiment of the present invention, the TFT is an n-channel IGZO backplane comprising a polycarbonate substrate with low optical retardation of 5 nm or better. This TFT is particularly suited for applications such as LCD TFT or solar cell devices applications.

The gate electrode (200) and the source and gate electrodes (450) comprise at least one of Al, Ti, Mo, AlNd, a stack metal electrode Ti/Al/Ti, or a transparent conducting oxide selected from the group consisting of indium tin oxide, indium doped zinc oxide, aluminum doped zinc oxide, fluorine tin oxide, antimony tin oxide, and mixtures thereof. Dependent on the circumstances, the appropriate material for the electrodes can be selected. For example, when employing transparent conducting oxides such as indium tin oxide (ITO), indium doped zinc oxide (IZO), aluminum doped zinc oxide (AZO), fluorine tin oxide (FTO), and antimony tin oxide (ATO) as material for the electrodes of the TFT of the present invention, an at least partially transparent TFT can be manufactured. Together with the flexibility and low thickness of the obtained TFT, the TFT is excellently suited for use in opto-electronic devices. Hence, in a preferred embodiment of the present invention, the gate electrode (200) and the source and gate electrodes (450) comprise at least one transparent conducting oxide selected from the group consisting of indium tin oxide (ITO), indium doped zinc oxide (IZO), aluminum doped zinc oxide (AZO), fluorine tin oxide (FTO), and antimony tin oxide (ATO).

The polymer substrate (100) of the TFT according to the present invention comprises a thermoplastic polymer film. Preferably, the thermoplastic polymer film comprises polycarbonates, polyethylene terephthalate, polyurethane, polyetherketones, polyethylene, polystyrene, polyvinylalcohole, epoxide resins or polyamides, in particular wherein the thermoplastic film has a glass transition temperature $T_g$ of at least 160° C. The aforementioned thermoplastic polymers are particularly suited as polymeric films in the substrate (100) of the TFT according to the present invention.

In a preferred embodiment of the present invention, the polymer substrate further comprises a hard coat planarizer film on at least one surface of the thermoplastic film. The hard coat planarizer is a UV cured acrylate or a thermally cured planarizer. Preferably, the hard coat of the polymer substrate comprises ionization curing polyesters and/or urethane acrylates. Using a hard coat layer provided on at least one side of the thermoplastic film increases the maximum processing temperature of the substrate, said processing temperature being defined as maximum temperature said coated thermoplastic film is subjected to without degradation to its physical and/or chemical nature. As materials for forming the hard coat layer there may be mentioned ionizing radiation curing resins, thermosetting resins, thermoplastic resins and engineering plastics, Ionizing radiation curing resins are preferred because they can be easily formed into films on plastic base films and can easily give the desired high pencil hardness values.

The following may be mentioned as ionizing radiation curing resins which can be used for the hard coat layer or the buffer layer.

The ionizing radiation curing resin is preferably one with an acrylate-based functional group, and more preferably a polyester acrylate or urethane acrylate. A polyester acrylate in this case preferably consists of an acrylate or methacrylate (throughout the present specification, acrylates and/or methacrylates will be referred to simply as (meth)acrylates) of a polyester-based polyol oligomer, or a mixture thereof. A urethane acrylate is a compound obtained by acrylating an oligomer made from a diisocyanate compound and a polyol compound.

As preferred acrylate-composing monomers there may be mentioned methyl (meth)acrylate, ethyl (meth)acrylate, butyl (meth)acrylate, 2-ethylhexyl (meth)acrylate, methoxyethyl (meth)acrylate, butoxyethyl (meth)acrylate and phenyl (meth)acrylate.

At the same time, a polyfunctional monomer may also be used to provide even greater hardness to the coating. Preferred examples of polyfunctional monomers include trimethylolpropane tri(meth)acrylate, hexanediol (meth)acrylate, tripropyleneglycol di(meth)acrylate, diethyleneglycol di(meth)acrylate, pentaerythritol tri(meth)acrylate, dipentaerythritol hexa(meth)acrylate, 1,6-hexanediol di(meth)acrylate and neopentylglycol di(meth)acrylate.

Preferred examples of polyester-based oligomers include polyadipate polyols and polysebacate polyols, which are condensation products of adipic acid and glycols (ethylene glycol, polyethylene glycol, propylene glycol, polypropylene glycol, butylene glycol, polybutylene glycol, etc.) or triols (glycerin, trimethylolpropane, etc.), and sebacic acid and glycols or triols.

A part or all of the aliphatic dicarboxylic acids mentioned above may be replaced with other organic acids. For example, isophthalic acid, terephthalic acid, phthalic anhydride or the like may be used as a constituent to provide greater hardness. Polyurethane-based oligomers can be obtained from condensation products of polyisocyanates and polyols. For example, they may be obtained by reaction between a compound selected from among methylenebis(p-phenylene diisocyanate) and hexamethylene diisocyanate hexanediol addition products, hexamethylene diisocyanate, tolylene diisocyanate and tolylene diisocyanate trimethylolpropane adducts, 1,5-naphthylene diisocyanate, thiopropyl diisocyanate, ethylbenzene-2,4-diisocyanate, 2,4-tolylene-diisocyanate dimers, hydrogenated xylylene diisocyanate, tris(4-phenylisocyanate) neophosphate, etc. and one of the following polyols.

Preferred examples of polyols include polyether-based polyols such as polyoxytetramethylene glycols; polyester-based polyols such as polyadipate polyols, polycarbonate polyols; and copolymers of acrylic acid esters and hydroxyethyl methacrylate, etc.

In addition, when an ionizing radiation curing resin is used as the ultraviolet curing resin, a photopolymerizing agent such as an amyloxym ester or thioxanthone, or a photosensitizing agent such as n-butylamine, triethylamine or tri-n-butylphosphine may be used in combination.

Urethane acrylates have high elasticity and flexibility and therefore offer superior workability (bendability), but they cannot give products with a pencil hardness of 2H or higher because of their poor surface hardness. On the other hand, polyester acrylates can provide hardness if the polyester constituents are appropriately selected.

The thermoplastic polymer film of polymer substrate (100) comprises polycarbonate, wherein said polycarbonate is a high molecular weight, thermoplastic, aromatic polycarbonate with $M_w$ (weight average of the molecular weight)

of at least 10 000, preferably from 20 000 to 300 000, which contain bifunctional carbonate structural units of formula (I),

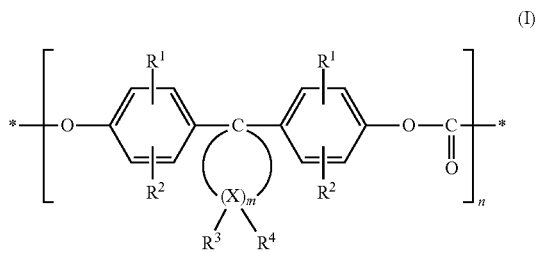

wherein
$R^1$ and $R^2$ independently of one another signify hydrogen, halogen, preferably chlorine or bromine, $C_1$-$C_8$ alkyl, $C_5$-$C_6$ cycloalkyl, $C_6$-$C_{10}$ aryl, preferably phenyl, and $C_7$-$C_{12}$ aralkyl, preferably phenyl-$C_1$-$C_4$-alkyl, particularly benzyl, m signifies an integer of from 4 to 7, preferably 4 or 5, $R^3$ and $R^4$ may be selected for each X individually and, independently of one another, signify hydrogen or $C_1$-$C_6$ alkyl and X signifies carbon, and n signifies an integer of 30 or greater, particularly preferably an integer of from 50 to 900, most particularly preferably an integer of from 60 to 250, with the proviso that, on at least one X atom, $R^3$ and $R^4$ simultaneously signify alkyl.

Starting products for the polycarbonates are dihydroxydiphenyl cycloalkanes of the formula (Ia)

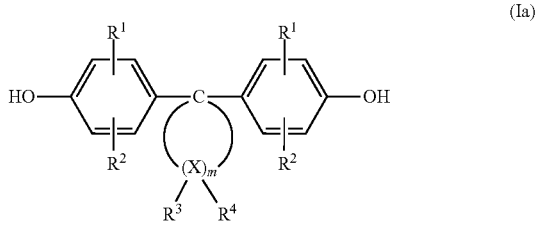

wherein
X, $R^1$, $R^2$, $R^3$, $R^4$, m and n have the meaning given for formula (I).

Preferably, $R^3$ and $R^4$ are simultaneously alkyl on one to two X atoms, particularly only on one X atom.

The preferred alkyl radical is methyl; the X atoms in alpha position to the diphenyl-substituted C atom (C-1) are preferably not dialkyl-substituted, however the alkyl disubstitution in beta position to C-1 is preferred.

In addition, the diphenols of formula (Ia) can also be used in a mixture with other diphenols, e.g. with those of formula (Ie)

for the production of high molecular weight, thermoplastic, aromatic polycarbonates.

Suitable other diphenols of formula (Ie) are those in which Z is an aromatic radical with 6 to 30 C atoms, which can contain one or more aromatic rings, can be substituted and can contain aliphatic radicals or cycloaliphatic radicals other than those of formula (Ia) or hetero atoms as bridge-type crosslinks.

Examples of the diphenols of formula (Ie) are: hydroquinone, resorcinol, dihydroxydiphenyls, bis-(hydroxyphenyl) alkanes, bis(hydroxyphenyl)cycloalkanes, bis(hydroxyphenyl) sulfides, bis-(hydroxyphenyl) ethers, bis (hydroxyphenyl) ketones, bis(hydroxyphenyl) sulfones, bis (hydroxyphenyl) sulfoxides, alpha,alpha'-bis (hydroxyphenyl) diisopropylbenzenes and the ring-alkylated and ring-halogenated compounds thereof.

These and other suitable diphenols are described e.g. in U.S. Pat. No. 3,028,365, U.S. Pat. No. 2,999,835, U.S. Pat. No. 3,148,172, U.S. Pat. No. 3,275,601, U.S. Pat. No. 2,991,273, U.S. Pat. No. 3,271,367, U.S. Pat. No. 3,062,781, U.S. Pat. No. 2,970,131 and U.S. Pat. No. 2,999,846, in DE-A 1 570 703, DE-A 2 063 050, DE-A 2 063 052, DE-A 2 211 956, Fr-A 1 561 518 and in the monograph "H. Schnell, Chemistry and Physics of Polycarbonates, Interscience Publishers, New York 1964".

Preferred other diphenols are e.g.: 4,4'-dihydroxydiphenyl, 2,2-bis(4-hydroxyphenyl)propane, 2,4-bis(4-hydroxyphenyl)-2-methylbutane, 1,1-bis(4-hydroxyphenyl)cyclohexane, alpha,alpha-bis(4-hydroxyphenyl)-p-diisopropylbenzene, 2,2-bis(3-methyl-4-hydroxyphenyl) propane, 2,2-bis(3-chloro-4-hydroxyphenyl)propane, bis(3, 5-dimethyl-4-hydroxyphenyl)methane, 2,2-bis(3,5-dimethyl-4-hydroxyphenyl)propane, bis(3,5-dimethyl-4-hydroxyphenyl)sulfone, 2,4-bis(3,5-dimethyl-4-hydroxyphenyl)-2-methylbutane, 1,1-bis(3,5-dimethyl-4-hydroxyphenyl)cyclohexane, alpha,alpha-bis(3,5-dimethyl-4-hydroxyphenyl)-p-diisopropylbenzene, 2,2-bis(3,5-dichloro-4-hydroxyphenyl)propane and 2,2-bis(3,5-dibromo-4-hydroxyphenyl)propane.

Particularly preferred diphenols of formula (Ie) are e.g.: 2,2-bis(4-hydroxyphenyl)propane, 2,2-bis-(3,5-dimethyl-4-hydroxyphenyl)propane, 2,2-bis(3,5-dichloro-4-hydroxyphenyl)propane, 2,2-bis(3,5-dibromo-4-hydroxyphenyl)propane and 1,1-bis(4-hydroxyphenyl)cyclohexane.

In particular, 2,2-bis(4-hydroxyphenyl)propene is preferred. The other diphenols can be used either individually or in a mixture.

The molar ratio of diphenols of formula (Ia) to the other diphenols of formula (Ie) optionally also used, should be between 100 mole % (Ia) to 0 mole % (Ie) and 2 mole % (Ia) to 98 mole % (Ie), preferably between 100 mole % (Ia) to 0 mole % (Ie) and 10 mole % (Ia) to 90 mole % (Ie) and particularly between 100 mole % (Ia) to 0 mole % (Ie) and 30 mole % (Ia) to 70 mole % (Ie).

The high molecular weight polycarbonates made from the diphenols of formula (Ia), optionally in combination with other diphenols, can be produced by the known polycarbonate production processes. The various diphenols in this case can be connected to one another either randomly or in blocks.

The polycarbonates according to the invention can be branched in a manner that is known per se. If branching is desired, it can be achieved in a known manner by incorporation by condensation of small quantities, preferably quantities of between 0.05 and 2.0 mole % (based on diphenols used), of trifunctional or more than trifunctional compounds, particularly those with three or more than three phenolic hydroxyl groups. Suitable branching agents with three or more than three phenolic hydroxyl groups are:

phloroglucinol, 4,6-dimethyl-2,4,6-tri-(4-hydroxyphenyl) heptene-2,4,6-dimethyl-2,4,6-tri-(4-hydroxyphenyl)heptane, 1,3,5-tri-(4-hydroxyphenyl)benzene, 1,1,1-tri-(4-hydroxyphenyl)ethane, tri-(4-hydroxyphenyl)phenylmethane, 2,2-bis-[4,4-bis(4-hydroxyphenyl)cyclohexyl]propane, 2,4-bis(4-hydroxyphenylisopropyl)phenol, 2,6-bis-(2-hydroxy- 5-methylbenzyl)-4-methylphenol, 2-(4-hydroxyphenyl)-2-(2,4-dihydroxyphenyl)propane, hexa-[4-(4-hydroxyphenylisopropyl)phenyl]-orthoterephthalic acid ester, tetra-(4-hydroxyphenyl)methane, tetra-[4-(4-hydroxyphenyl-isopropyl)phenoxy]methane and 1,4-bis-[4',4''-dihydroxytriphenyl)methyl]benzene.

Some of the other trifunctional compounds are 2,4-dihydroxybenzoic acid, trimesic acid, cyanuric chloride and 3,3-bis(3-methyl-4-hydroxyphenyl)-2-oxo-2,3-dihydroindole.

As chain terminators for the regulation of the molecular weight of the polycarbonates, which is known per se, monofunctional compounds are used in conventional concentrates. Suitable compounds are e.g. phenol, tert.-butyl-phenols or other alkyl-substituted phenols. To regulate the molecular weight, small quantities of phenols of formula (If) are particularly suitable

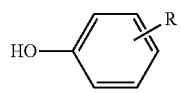 (If)

wherein
R represents a branched $C_8$ and/or $C_9$ alkyl radical.

The proportion of $CH_3$ protons in the alkyl radical R is preferably between 47 and 89% and the proportion of CH and $CH_2$ protons between 53 and 11%; it is also preferred for R to be in o- and/or p-position to the OH group, and particularly preferred for the upper limit of the ortho fraction to be 20%. The chain terminators are generally used in quantities of 0.5 to 10, preferably 1.5 to 8 mole %, based on diphenols used.

The polycarbonates can preferably be produced by the interfacial polycondensation process (cf. H. Schnell "Chemistry and Physics of Polycarbonates", Polymer Reviews, vol. IX, page 33 et seq., Interscience Publ. 1964) in a manner that is known per se.

In this process, the diphenols of formula (Ia) are dissolved in an aqueous alkaline phase. To produce copolycarbonates with other diphenols, mixtures of diphenols of formula (Ia) and the other diphenols, e.g. those of formula (Ie), are used. To regulate the molecular weight, chain terminators e.g. of formula (If) can be added. Then, in the presence of an inert organic phase, preferably one which dissolves polycarbonate, a reaction with phosgene is carried out by the interfacial polycondensation method. The reaction temperature is between 0° C. and 40° C.

The branching agents that are optionally also used (preferably 0.05 to 2.0 mole %) can either be initially present in the aqueous alkaline phase with the diphenols or added in solution in the organic solvent before phosgenation. In addition to the diphenols of formula (Ia) and optionally other diphenols (Ie), it is also possible to incorporate their mono- and/or bischlorocarbonates, these being added in solution in organic solvents. The quantity of chain terminators and branching agents then depends on the molar amount of diphenolate groups according to formula (Ia) and optionally formula (Ie); when chlorocarbonates are incorporated, the amount of phosgene can be reduced accordingly in a known manner.

Suitable organic solvents for the chain terminators and optionally for the branching agents and the chlorocarbonates are e.g. methylene chloride and chlorobenzene, particularly mixtures of methylene chloride and chlorobenzene. The chain terminators and branching agents used may optionally be dissolved in the same solvent.

Methylene chloride, chlorobenzene and mixtures of methylene chloride and chlorobenzene, for example, are used as the organic phase for the interfacial polycondensation.

NaOH solution, for example, is used as the aqueous alkaline phase. The production of the polycarbonates by the interfacial polycondensation process can be catalysed in a conventional manner by catalysts such as tertiary amines, particularly tertiary aliphatic amines such as tributylamine or triethylamine; the catalysts can be used in quantities of from 0.05 to 10 mole %, based on moles of diphenols used. The catalysts can be added before the beginning of phosgenation or during or even after phosgenation.

The polycarbonates can be produced by the known process in the homogeneous phase, the so-called "pyridine process", and by the known melt transesterification process using, for example, diphenyl carbonate instead of phosgene.

The polycarbonates preferably have a molecular weight $M_w$ (weight average, determined by gel permeation chromatography after previous calibration) of at least 10 000, particularly preferably from 20 000 to 300 000 and particularly from 20 000 to 80 000. They can be linear or branched and they are homopolycarbonates or copolycarbonates based on the diphenols of formula (Ia).

In addition, by means of composition with other diphenols as desired, particularly with those of formula (Ie), the polycarbonate properties can be favourably varied. In these copolycarbonates, the diphenols of formula (Ia) are contained in quantities of from 100 mole % to 2 mole %, preferably in quantities of from 100 mole % to 10 mole % and particularly in quantities of from 100 mole % to 30 mole %, based on the total quantity of 100 mole % of diphenol units, in polycarbonates.

Particularly preferred polycarbonates are copolycarbonates of formula (I-h), wherein the comonomers can be in an alternating, block or random arrangement in the copolymer, p+q=n and the ratio of q and p to one another behaves as reflected by the mole % data mentioned in the previous section for formulae (Ie) and (Ia).

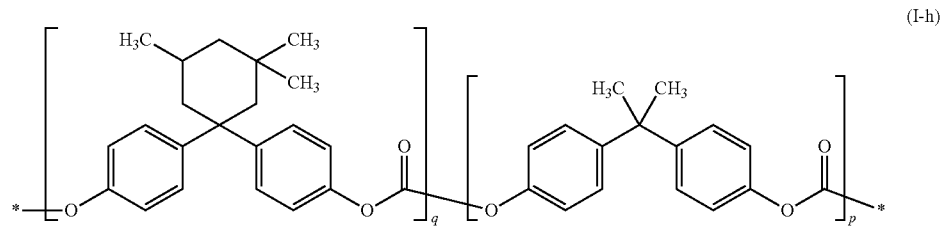 (I-h)

The comonomers can be in an alternating, block or random arrangement in the copolymer, p+q=n and the ratio of q is such that the diphenols containing the spirocompound are contained in quantities of from 100 mole % to 2 mole %, preferably of from 100 mole % to 10 mole % and particularly preferred of from 100 mole % to 30 mole %, based on the total quantity of 100 mole % of diphenol units, in polycarbonates.

These polycarbonates possess, in addition to their high heat resistance, good UVW stability and good flow properties in the melt. In particular, the combination of the abovementioned polycarbonate with the aforementioned UV hard coats give rise to beat-stable composite films having a $T_G$ of at least 160° C., which is important for production processes in which the TFT layers are deposited and annealed on the polymer substrate layer.

In a further preferred embodiment of the present invention, the polymer film substrate of the TFT according to the present invention has a thickness in the range of from ≥50 μm to ≤350 μm, preferably in the range of from ≥75 μm to ≤175 μm, more preferably in the range of from ≥80 μm to ≤115 μm, and the at least one hard coat has a thickness in the range of from ≥3 μm to ≤15 μm, preferably in the range of from ≥3 μm to ≤10 μm. Surface strain for the gate dielectric is lowered when the polymer base film thickness is within the above ranges.

APEC Polycarbonate films having a UV hard coat on at least one side which are particularly useful in the present invention are, for example, polymers of the Makrofol® series from Bayer MaterialScience, in particular Makrofol® HS 279.

The present invention further provides a method for producing a thin film transistor on a polymer substrate, the method comprising the steps of
(a) laminating a polymer substrate (100) comprising a thermoplastic polymer film, preferably further comprising a hard coat on at least one surface of the thermoplastic film, preferably a planarized UV cured acrylate hard coat planarizer or thermally cured hard coat planarizer onto a glass carrier;
(b) depositing a layer of aluminum oxide on the polymer substrate (100), thereby forming a barrier and adhesion layer (150);
(c) depositing gate electrode layer (200), the step comprising depositing a metal and/or metal oxide film and a subsequent photolithographic treatment;
(d) coating with methylsiloxane having a methyl content in the range of from ≥1 wt.-% to ≤13 wt.-%, preferably in the range of from ≥6 wt.-% to ≤11.5 wt.-% and subsequent annealing at a lower temperature than $T_G$ of the polymer substrate, thereby forming the gate insulating film (300);
(e) depositing a metal and/or metal oxide film and carrying out a photolithographic treatment to form source drain pattern (450);
(f) depositing an oxide layer comprising at least one oxide of Hf, In, Ga or Zn to form semiconductor layer (500), wherein the metal or metal oxide of (c) and (e) comprise at least one of Al, Ti, Mo, AlNd, a stack metal electrode Ti/Al/Ti, or a transparent conducting oxide selected from the group consisting of indium tin oxide, indium doped zinc oxide, aluminum doped zinc oxide, fluorine tin oxide, antimony tin oxide, and mixtures thereof.

Coating with methylsiloxane having a methyl content in the above ranges gives rise to a high temperature resistance and better CTE match between the methylsiloxane layer and the polymer substrate. This has the effect that the risk for cracking of the film is lowered to an extent acceptable for industry applications. Furthermore, a common problem in production of TFT on polymer substrates exists in that misalignments of the source and drain electrode to the gate electrode might arise when the polymer film substrate is heated and cooled during photolithography processing and gate dielectric heating and processing. This problem is already partially solved when using said methylsiloxane layer, and better results are generally obtained when annealing the polymer substrate in a previous step. In the method according to the present invention, the polymer substrate is laminated in a first step onto glass carrier. Lamination can be carried out by means of a mechanical roller or other suitable means well known to the skilled person. Preferably, the lamination is made more secure by applying a soft press technology wherein air pressure up to 6 MPa is used. This has the effect of increasing the adhesion of the film to the laminate and to reduce the non-uniformity in the lamination. It is further preferred that prior to laminating the polymer substrate onto the glass carrier the polymer substrate is annealed. Annealing is carried out preferably by heating the film up to 200° C., preferably up to 180° C., in air or, more preferred, in vacuum. Annealing in vacuum or air at these temperatures is preferably carried out over a period of time in the range of from 1 to 6 h, preferably in the range of from 2 to 5 h, more preferably in the range of from 3 to 4 h. The annealing time was found to be a parameter that controlled the alignment of the source drain electrode to the gate electrode.

After that, it is preferred to deposit a layer of aluminum oxide (150) on the polymer substrate (100). This layer serves as a water vapour and oxygen barrier as well as an adhesion layer for the aluminum gate. Preferably, depositing the barrier and adhesion layer (150) is carried out by means of atomic layer deposition method as common in the art. It is further preferred that the barrier and adhesion layer (150) has a thickness in the range of from 10 to 30 nm, preferably in the range of from 15 to 25 nm.

Deposition of the gate electrode (layer 200) can be carried out by common means in the art suitable for this task. For example, an aluminum film can be deposited by means of E-beam evaporation, e.g. to a thickness in the range of from 100 to 300 nm, preferably in the range of from 150 to 250 nm. The photolithographic step preferably comprises depositing an hexamethyldisilazane or hexamethyldisiloxane (HMDS) film to promote adhesion, depositing a photoresist film which may be baked or annealed, exposing the film using a lithographic mask with the corresponding desired gate pattern, developing the film, etching the film and removing the remaining photoresist film, thereby obtaining the gate array. Preferably, a thin photoresist film is used, preferably having a thickness in the range of from 0.2 to 1 μm, more preferably in the range of from 0.4 to 0.8 μm. The use of a photoresist film having a thickness within the preferred ranges has the advantage that removal of the film is easier such as by means of a dry etching process instead of using a wet chemical stripper which could damage the substrate. In a further preferred embodiment of the present invention, alignment marks are made on the substrate for aligning with the subsequent layers like source/drain pattern and channel island, such as depicted in FIG. 9. Preferably, said alignment marks are aligned in a centro-symmetric manner as shown in said figure. The use of the alignment marks in the method according to the present invention increases the precision in aligning the respective parts of the TFT, thereby increasing quality of the manufactured TFTs.

Coating with the methylsiloxane having a methyl content in the ranges as describe above and annealing the obtained layer is also one of the steps where the problems of misalignments of source and drain electrodes can be controlled. Coating itself is preferably carried out by means of a spin-on glass method well known to the skilled person. The spin-coated films are then annealed. Of particular importance is the requirement that annealing is to be carried out at a temperature below the glass temperature $T_G$ of the polymer substrate. Keeping the annealing temperature well under To of the polymer substrate helps to prevent the introduction of defects into the polymer base substrate. Again, the annealing time was found to be a key factor. Annealing is carried out preferably by heating the film up to 200° C., preferably up to 180° C., in air, preferably under an inert gas such as nitrogen, argon and/or helium. Annealing at these temperatures is preferably carried out over a period of time in the range of from $\geq 0.5$ h to $\leq 10$ h, preferably in the range of from $\geq 1$ h to $\leq 6$ h, more preferably in the range of from $\geq 1.5$ h to $\leq 4$ h.

In the next step, the metal or metal oxide film is deposited before carrying out a photolithographic treatment to form the source drain pattern. This step preferably comprises depositing a film having a thickness in the range of from 100 to 400 nm, preferably in the range of from 150 to 250 nm, thereby forming film (400). This step further preferably comprises depositing an HMDS and subsequently a photoresist layer as previously described, then preferably aligning the alignment marks on the source drain pattern to the alignment marks on the device wafer in a centro-symmetric manner to optimize the alignment of source and drain electrode to the gate electrode, exposing and developing the film. Etching and stripping of the photoresist may also be done as previously described.

The next step, i.e., deposition of preferably the indium gallium zinc oxide (IGZO) layer to form semiconductor layer (500), i.e., IGZO channel island, preferably comprises depositing another layer of HMDS and a layer of photoresist. Preferably, the layer of photoresist is thicker than the photoresists layers in the other films. This step preferably further comprises aligning the previously formed gate pattern to the semiconductor pattern and exposing and developing the film as known in the art. Furthermore, the IGZO may be then deposited by sputtering such as sputtering in argon-nitrogen plasma. Preferably, a pre-lift off cleaning step comprising the use of dry $CO_2$ is then performed previously to lift off which may be carried out by dipping in acetone. The use of this cleaning step comprising the use of dry $CO_2$ has the effect of removing the stress in the TFT, allowing to proceed with lift off without the danger of cracking the polymer substrate. The IGZO layer can further be cleaned by sonication in acetone.

With regard to the polymer substrate used in the method according to the present invention, the same films in connection with the same ranges and combination of ranges as previously described in conjunction with the TFT may be used.

The TFT according to the present invention, including the TFT obtained in the method according to the present invention, is excellently suited for applications as backplane for LCD TFT displays and solar cell devices. Hence, the present invention further provides a use of the TFT according to the present invention as backplane for LCD TFT displays and solar cells.

EXAMPLES

Example 1

APEC Polycarbonate (80 µm) coated both sides with a 4 µm high cross linked UV acrylate planarizer (Makrofol® HS279, layer 100, Bayer Material Science AG) sheets were heat treated in Dry Oven (Binder FDL 115) at 180° C. for 72 hours. The film turned slightly yellow. However, pre-annealing in a vacuum oven prevented photo-oxidation and yellowing, and was transparent after 72 hours annealing in vacuum to remove water in the polycarbonate film. Samples of dimensions 35 cm×35 cm were cut.

Example 2

The samples (bottom planarizer coating) obtained in example 1 were laminated onto a glass carrier using a manual roller at room temperature with an Intelimer Tape from Nitta Corporation, (CS2325NA3). For even better lamination, the lamination may be done at 150° C. with an Obducat soft press technology up to 6 MPA (60 bars) so as to achieve a highly optically flat film laminated firmly onto the glass carrier). The samples were then cleaned by sonication in isopropyl alcohol (IPA).

Example 3

An 18 nm coating of aluminum oxide (layer 150) was deposited on top of the planarizer coating of the samples obtained in example 3 by Atomic layer deposition at 150° C. (Savannah 100 from Cambridge Nanotech Inc.) as a water vapour and oxygen barrier as well as an adhesion layer for the aluminum gate.

Example 4

Figure 1:
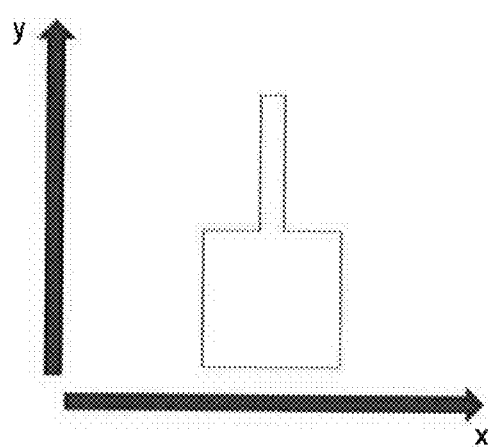
FIG. 1 shows the shrinkage in MD for a 72 h annealed polycarbonate substrate used in the present invention (Makrofol® HS 279). On the x-axis is the shrinkage in MD=0.010% in a thermal shrinkage test (150° C., 30 min). On the y-axis is the shrinkage in TD=0.000% in a thermal shrinkage test (150° C., 30 min).
Figure 2:
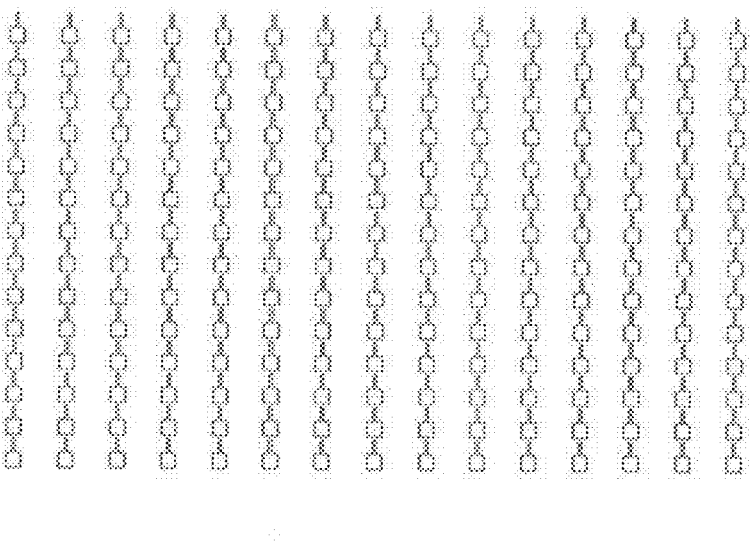
FIG. 2 shows a metal gate array.

A 200 nm aluminum film was deposited by E-beam evaporation (Edwards Auto 306) on the film obtained in example 3. A hexamethyldisoloxane (HMDS) monolayer film was deposited by HMDS oven (Yield engineering) to promote adhesion to photoresist. A Z1505 photoresist was spun at a speed of 4000 rpm for 60 seconds to yield a film having a thickness of about 0.6 μm. The photoresist film was then baked at 95° C. for 60 seconds. The film was then exposed using a Karl Suss MA8 contact aligner system and a quartz chrome lithographic mask with the gate pattern for an array of 210 TFTs as in FIG. 2. The exposed film was then developed for 20 seconds in AZ developer diluted with water in the ratio 1:1. Then the sample was dipped in Transene Aluminium etchant at 50° C. for 75 seconds to etch the aluminum not covered by the photoresist. The photoresist was then subsequently stripped in a reactive ion etching (RIE) system (Oxford plasma) using oxygen as the etching gas for 8 minutes. The use of the relatively thinner photoresist film made it easier to strip it away by a dry etching process ($O_2$ RIE) instead of using a wet chemical stripper which would have damaged the substrate. Alignment marks were made on the substrate for aligning with the subsequent layers like source/drain and channel island. The gate array is shown in FIG. 2.

Example 5

Figure 3:
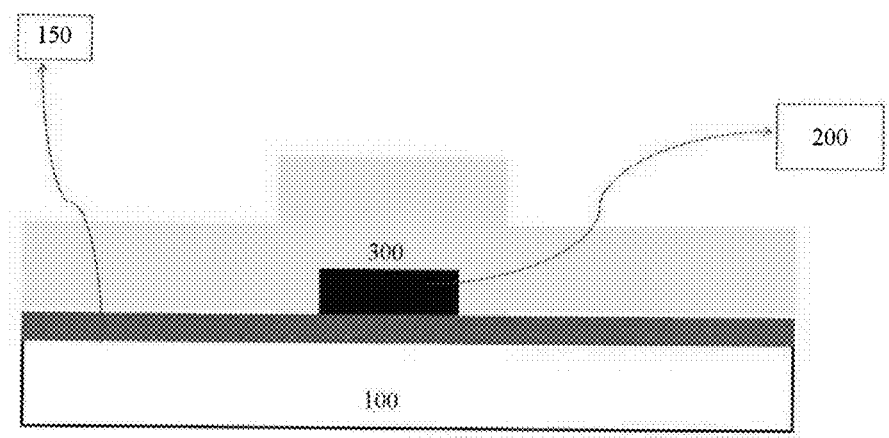
FIG. 3 depicts the cross section of the thin film transistor up to the gate insulator. In particular, on top of the bottom polymer substrate layer (100) is the barrier and adhesion layer (150), the gate electrode (200) and the gate insulator (300).

T-314 Spin-On Glass from Honeywell electronic materials was spun at 1000 rpm for 60 s. The spin coated samples were then baked on hot plate inside a nitrogen filled glove box at 120° C. for 2 min and subsequently at 150° C. The misalignment of the source and drain electrode to the gate electrode could be reduced with longer heating time. A 3 hour annealed sample was found to have better alignment than a 2 hour annealed sample. Thermal heating was capped at 150° C. so as to not exceed the $T_g$ of HS 279 at 170° C. A thickness of 340 nm was obtained for the methyl siloxane layer (300). FIG. 3 shows a cross section of the structure.

Example 6

Figure 4:
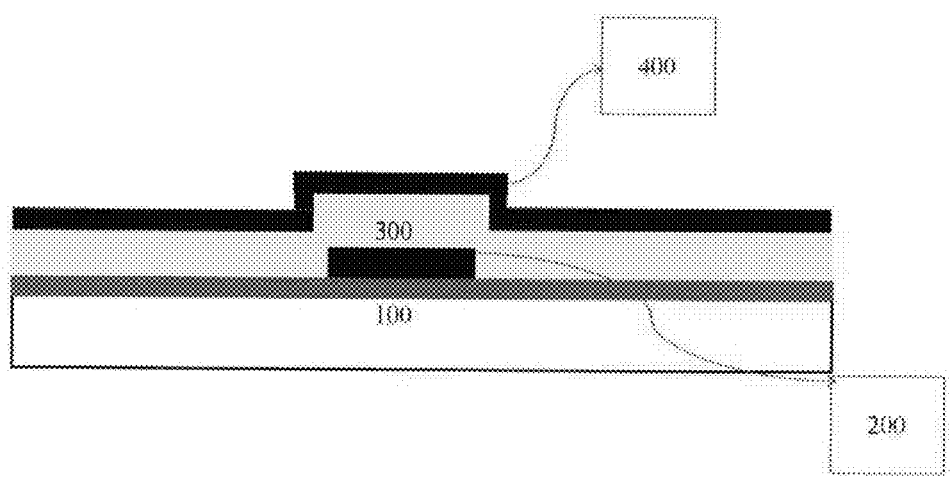
FIG. 4 shows essentially the same parts as FIG. 5 except for the film (400) on the gate insulator layer (300).
Figure 5:
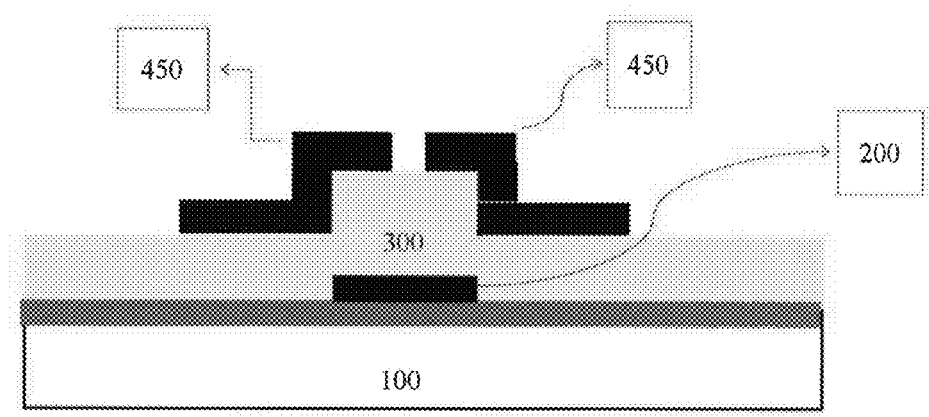
FIG. 5 depicts the finished source drain pattern (450) after the photolithographic treatment of layer (400).

An aluminum film of 200 nm was deposited onto the gate insulator (layer 400) as shown in FIG. 4). Then HMDS and photoresist film was deposited as described earlier. The three alignment marks on the source drain pattern on the quartz chrome mask were aligned to the three alignment marks on the HS 279 device wafer in a centro-symmetric manner to optimize the alignment of source and drain electrode to the gate electrode. The photoresist film was exposed and developed. Etching the aluminum and stripping of the photoresist was also done as described earlier to yield the source drain pattern (layer 450) which is shown in FIG. 5.

Example 7

Figure 6:
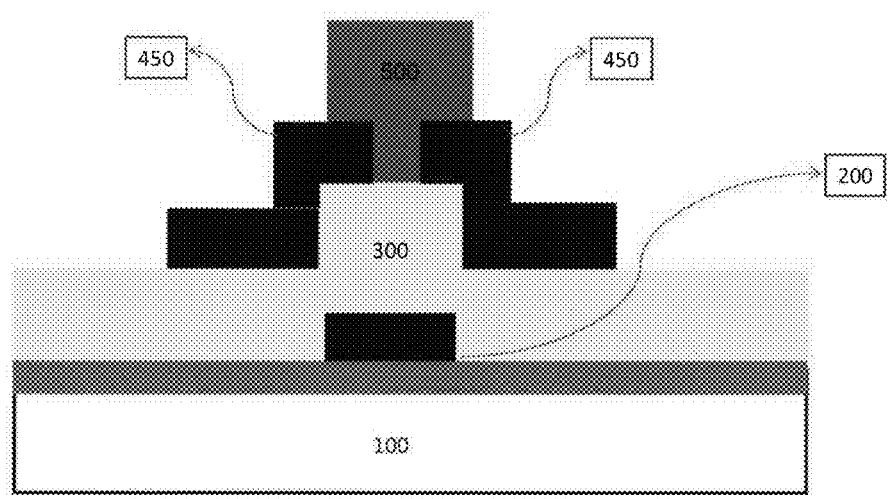
FIG. 6 finally shows the crosslink of a finished TFT, comprising the polymer substrate (100), barrier and adhesion layer (150), the gate electrode (200), gate insulator (300), source drain pattern (450) and IGZO channel island (500).

Another layer of HMDS and a thicker AZ5214E photoresist film were spin coated. The gate pattern was aligned to the channel semiconductor pattern on a quartz chrome mask by using the MA8 aligner. Then the film was exposed using an image reversal process and developed using AZ400K developer. A 35 nm IGZO layer (layer 500) was deposited by RF sputtering (Nanofilm) using Ar:$N_2$ as sputtering gas. The sample was then subjected to a pro-lift off cleaning step using wafer clean 2100 (Eco-snow systems) which utilises dry $CO_2$. The substrate was then dipped in acetone for 25 minutes to lift off followed by sonication in acetone for 5 minutes to yield a clean IGZO oxide TFT as in FIG. 6. There was an only slight damage to the edge of the substrate observed, which was probably caused by acetone.

Example 8

Another layer of HMDS and AZ 1505 photoresist film was deposited as described earlier. The gate pattern was aligned to a pattern to open via contact to gate on a quartz chrome mask by using the MA8 aligner and then the film was exposed and developed. 15 minutes etching of the methyl siloxane gate insulator layer on top of the gate bond pads was carried out in a RIE system using Ar—$CHF_3$ etching gas mixture and the photoresist was stripped as described earlier in example 5.

Example 9

Figure 7:
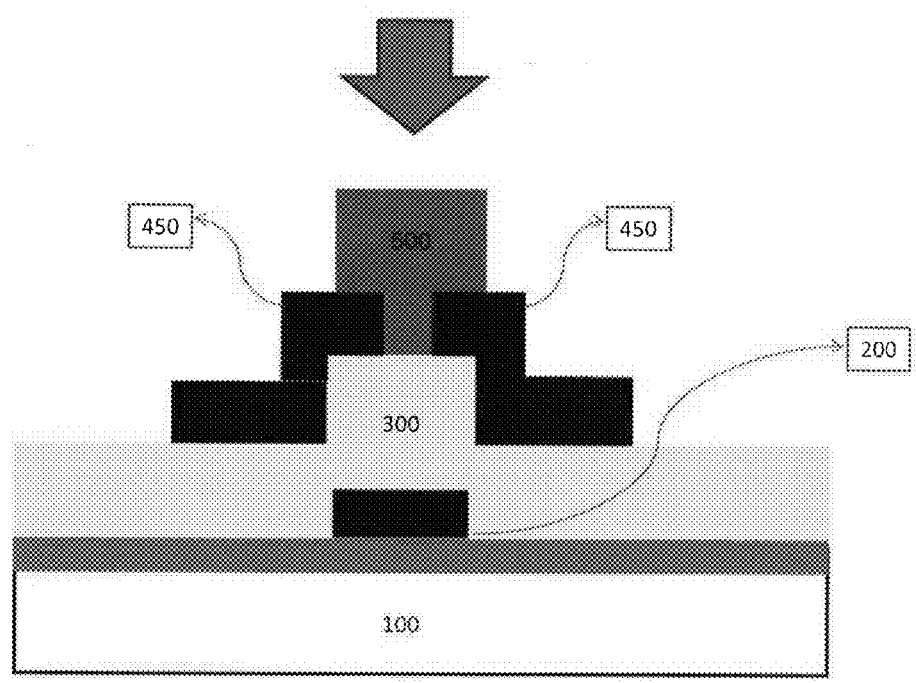
FIG. 7 shows the final DUV treatment of the TFI.
Figure 8:
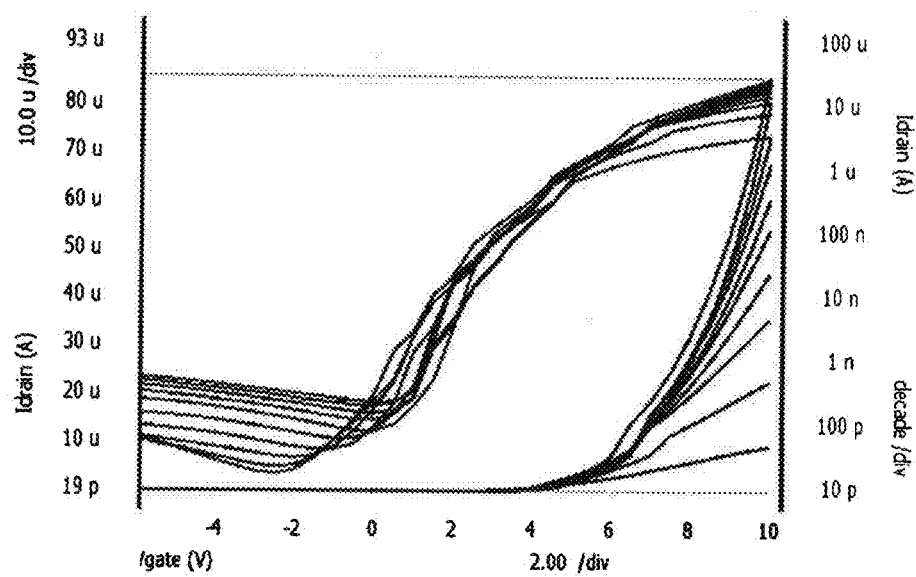
FIG. 8 depicts the transfer characteristics of said TFT which has been annealed for 2 h at 150° C. in an nitrogen atmosphere. The TFT showed a field effect mobility of approximately 35 $cm^2$/Vs and On/Off ratio of approximately $0.5 \cdot 10^6$.
Figure 9:
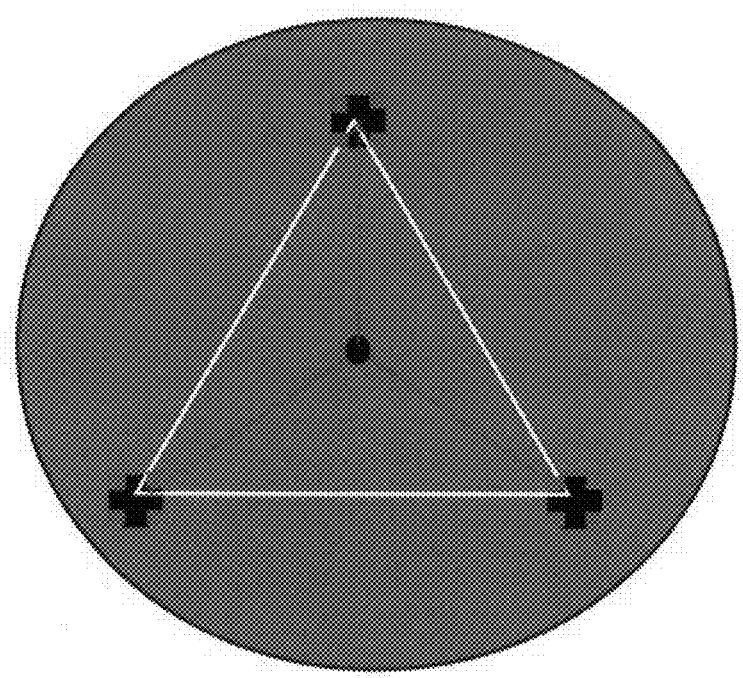
FIG. 9 shows a single IGZO oxide TFT on a polycarbonate substrate comprising source, drain, gate and a channel according to the present invention.
Figure 9:
Figure 9:
Figure 10:
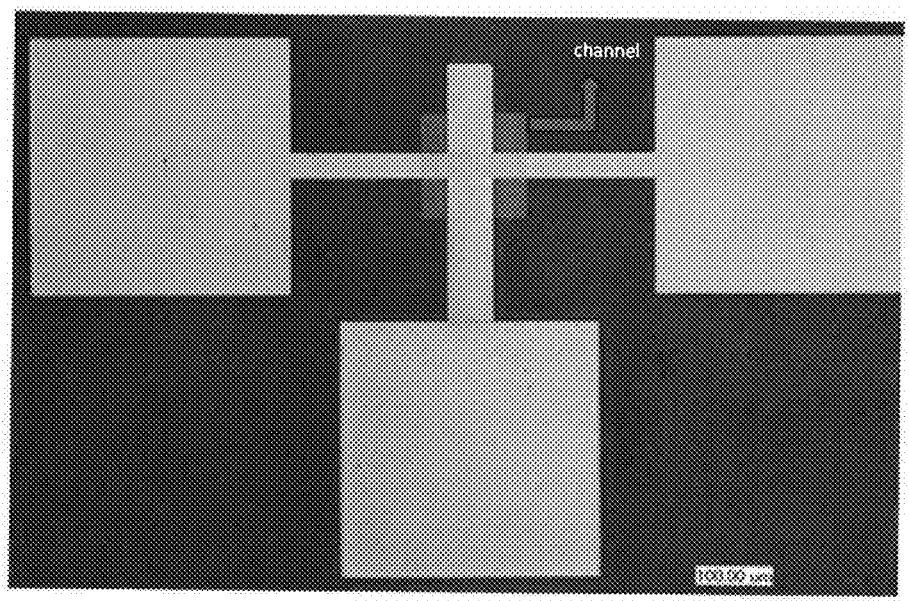
FIG. 10 shows the centrosymmetric alignment according to an embodiment of the present invention. The centrosymmetric alignment comprises using three alignment marks, equidistant from each other, at the apex of an equilateral triangle. This alignment method optimizes the alignment of the source and drain electrode in the gate of the transistors over the array. The alignment mark for the gate is the cross and the alignment mark for source and drain consists of four squares.

A sample obtained in example 8 was then annealed in a glove box at 150° C. for 3 hours. This was followed by a further deep ultra violet (DUV) (184 nm to 265 nm) annealing of the transistor in a nitrogen environment, (see FIG. 7). The DUV was readily absorbed by the IGZO semiconductor (band gap of ~3.3 eV, with corresponding wavelength λ~375.7 nm), which in turn annealed the IGZO semiconductor as well as the methyl siloxane gate dielectric in the area of the channel. An example of a transistor annealed at 150° C. for 2 hours in nitrogen showed a field effect mobility of ~35 $cm^2$/Vs and On/Off ratio of ~0.5×$10^6$ (transfer characteristics are shown in FIG. 8).

The invention claimed is:

1. A thin film transistor on a polymer substrate, comprising:
   a gate electrode;
   a gate insulating film covered by the gate electrode, the gate insulating film comprising methylsiloxane having a methyl content in the range of from ≥1 wt.-% to ≤13 wt.-%;
   a semiconductor channel layer placed to face the gate electrode with the gate insulating film interposed there between, the semiconductor channel layer comprising at least one of a metal oxide semiconductor including an oxide of at least one of Hf, In, Ga, or Zn and mixtures thereof;
   a source drain pattern comprising a source electrode connected to the semiconductor layer and a drain electrode separated from the source electrode and connected to the semiconductor layer,
   wherein the semiconductor layer has a source portion that contacts the source electrode, a drain portion that contacts the drain electrode, and a channel portion that is located between the source and drain portions;
   wherein the gate electrode and the source and gate electrodes comprise at least one of Al, Ti, Mo, AlNd, a stack metal electrode Ti/Al/Ti, or a transparent conducting oxide selected from the group consisting of indium tin oxide, indium doped zinc oxide, aluminum doped zinc oxide, fluorine tin oxide, antimony tin oxide, and mixtures thereof;
   a polymer substrate comprising a thermoplastic polymer film.

2. The thin film transistor according to claim 1, wherein the polymer substrate further comprises a planarized hard coat layer on at least one side of the thermoplastic polymer film, and wherein the planarized hard coat layer comprises a UV cured acrylate or a thermally cured planarizier.

3. The thin film transistor according to claim 1, wherein the thermoplastic polymer film of polymer substrate comprises polycarbonates, polyethylene terephthalate, polyurethane, polyetherketones, polyethylene, polystyrene, polyvinylalcohole, epoxide resins or polyamides, wherein the thermoplastic polymer film has a $T_g$ of at least 160° C.

4. The thin film transistor according to claim 2, wherein the hard coat of the polymer substrate comprises ionization curing polyester acrylate and/or urethane acrylate.

5. The thin film transistor according to claim 1, wherein the thermoplastic polymer film of polymer substrate comprises polycarbonate, wherein said polycarbonate is a high molecular weight, thermoplastic, aromatic polycarbonate with $M_w$ (weight average of the molecular weight) of at least 10 000, which comprise bifunctional carbonate structural units of formula (I),

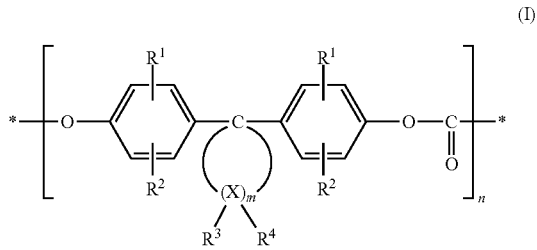

wherein
$R^1$ and $R^2$ independently of one another are hydrogen or halogen,
m is an integer of from 4 to 7,
$R^3$ and $R^4$ is selected for each X individually and, independently of one another, is hydrogen or $C_1$-$C_6$ alkyl and
X is carbon, and
n is an integer of 30 or greater,
with the proviso that, on at least one X atom, $R^3$ and $R^4$ simultaneously are alkyl.

6. The thin film transistor according to claim 5, wherein the polycarbonate is a copolycarbonate having structural units of formula (I-h)

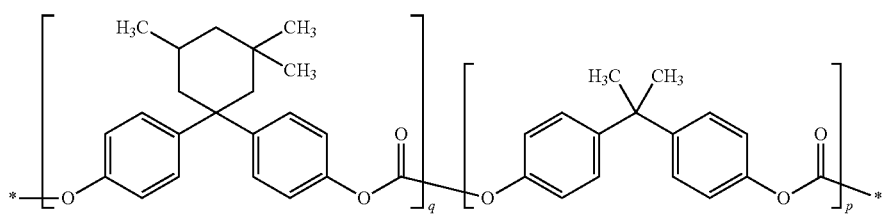

wherein the comonomers can be in an alternating, block or random arrangement in the copolymer, p+q=n and the ratio of q is such that the diphenols containing the spirocompound are contained in quantities of from 100 mole % to 2 mole %, based on the total quantity of 100 mole % of diphenol units, in polycarbonates.

7. The thin film transistor according to claim 2, wherein the thermoplastic polymer film has a thickness in the range of from ≥50 μm to ≤350 μm and the hard coat has a thickness in the range of from ≥3 μm to ≤15 μm.

8. A method utilizing the thin film transistor according to claim 1 as TFT backplane for active matrix displays.

9. A method for producing a thin film transistor on a polymer substrate, the method comprising the steps of:
(a) laminating a polymer substrate comprising a thermoplastic polymer film onto a glass carrier;
(b) depositing a layer of aluminum oxide on the polymer substrate, thereby forming a barrier and adhesion layer;
(c) depositing gate electrode layer, the step comprising depositing a metal and/or metal oxide film and a subsequent photolithographic treatment;
(d) coating with methylsiloxane having a methyl content in the range of from ≥1 wt.-% to ≤13 wt.-%, and subsequent annealing at a lower temperature than $T_G$ of the polymer substrate, thereby forming the gate insulating film;
(e) depositing a metal and/or metal oxide film and carrying out a photolithographic treatment to form source drain pattern;
(f) depositing an oxide layer comprising at least one oxide of Hf, In, Ga or Zn to form semiconductor layer,
wherein the metal or metal oxide of (c) and (e) comprise at least one of Al, Ti, Mo, AlNd, a stack metal electrode Ti/Al/Ti, or a transparent conducting oxide selected from the group consisting of indium tin oxide, indium doped zinc oxide, aluminum doped zinc oxide, fluorine tin oxide, antimony tin oxide, and mixtures thereof.

10. The method according to claim 9, wherein the thermoplastic polymer film of polymer substrate comprises polycarbonates, polyethylene terephthalate, polyurethane, polyetherketones, polyethylene, polystyrene, polyvinylalcohole, epoxide resins or polyamides, wherein the thermoplastic film has a $T_g$ of at least 160° C.

11. The method according to claim 9, wherein the thermoplastic polymer film of polymer substrate comprises polycarbonate, wherein said polycarbonate is a high molecular weight, thermoplastic, aromatic polycarbonate with $M_w$ (weight average of the molecular weight) of at least 10 000, which contain bifunctional carbonate structural units of formula (I),

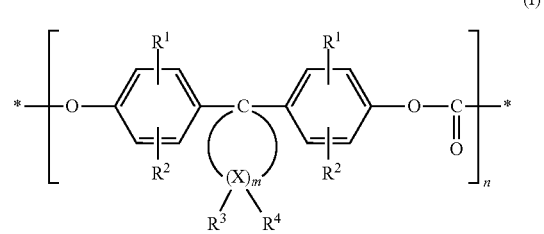

wherein
$R^1$ and $R^2$ independently of one another are hydrogen or halogen, m is an integer of from 4 to 7, $R^3$ and $R^4$ may be selected for each X individually and, independently of one another, and are hydrogen or $C_1$-$C_6$ alkyl and X is carbon, and n is an integer of 30 or greater, with the proviso that, on at least one X atom, $R^3$ and $R^4$ simultaneously are alkyl.

12. The method according to claim 9, wherein the annealing in step d) is carried out over a time in the range of from ≥0.5 h to ≤10 h.

13. The method according to claim 9, wherein the polymer substrate further comprises a planarized hard coat layer on at least one side of the thermoplastic polymer film, and wherein the planarized hard coat layer comprises a UV cured acrylate or a thermally cured planarizier.

14. The method according to claim 9, wherein the methylsiloxane in step d) has a methyl content in the range of from ≥6 wt.-% to ≤11.5 wt.-%.

* * * * *